United States Patent
Aguiar et al.

(10) Patent No.: US 10,952,315 B2
(45) Date of Patent: Mar. 16, 2021

(54) LIGHT BLOCKING FEATURES FOR INDICATOR LIGHTS IN AN APPLIANCE

(71) Applicant: Haier US Appliance Solutions, Inc., Wilmington, DE (US)

(72) Inventors: Ricardo Alberto Aguiar, Louisville, KY (US); Brian J. Morman, Louisville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 0 days.

(21) Appl. No.: 16/524,622

(22) Filed: Jul. 29, 2019

(65) Prior Publication Data

US 2021/0037641 A1 Feb. 4, 2021

(51) Int. Cl.
*H05K 1/00* (2006.01)
*H05K 1/02* (2006.01)
*H03K 17/96* (2006.01)

(52) U.S. Cl.
CPC ......... *H05K 1/0274* (2013.01); *H03K 17/962* (2013.01); *F25D 2400/361* (2013.01); *H05K 2201/10106* (2013.01)

(58) Field of Classification Search
CPC ....... H05K 1/0274; H05K 2201/10106; H03K 7/962; F25D 2400/361
See application file for complete search history.

(56) References Cited

U.S. PATENT DOCUMENTS

| 7,915,553 B2 | 3/2011 | Arione et al. |
| 8,136,960 B2 | 3/2012 | Wu |
| 9,735,198 B2 * | 8/2017 | Joo ........................ H01L 27/15 |
| 10,051,726 B2 | 8/2018 | Gustafsson |
| 10,333,573 B2 * | 6/2019 | Hayes ..................... H04B 1/18 |
| 2009/0086482 A1 * | 4/2009 | Wilm ....................... F21V 9/08 362/235 |
| 2010/0090847 A1 * | 4/2010 | Hendren ............... G06F 1/1656 340/636.1 |
| 2013/0194780 A1 * | 8/2013 | Didat ..................... D06F 34/28 362/85 |
| 2014/0094303 A1 * | 4/2014 | Wabschall .......... G07F 17/3211 463/31 |
| 2015/0182319 A1 * | 7/2015 | Wagner ............. A61C 17/0202 132/308 |
| 2016/0056354 A1 * | 2/2016 | Shan .................. H01L 25/0753 257/88 |
| 2016/0100479 A1 | 4/2016 | Henrich |
| 2017/0138573 A1 * | 5/2017 | Spiel ...................... F21V 3/062 |
| 2017/0185150 A1 * | 6/2017 | Yang ..................... G06F 3/015 |
| 2017/0215242 A1 * | 7/2017 | Wiegand ............... H05B 45/20 |
| 2018/0232895 A1 * | 8/2018 | Modestine ......... G06K 9/00221 |
| 2018/0338120 A1 * | 11/2018 | Lemberger ......... G06K 9/00718 |

FOREIGN PATENT DOCUMENTS

WO WO2015049193 A1 4/2015

* cited by examiner

*Primary Examiner* — Ojiako K Nwugo
(74) *Attorney, Agent, or Firm* — Dority & Manning, P.A.

(57) ABSTRACT

An appliance includes a user interface assembly. The user interface assembly includes a plurality of indicator lights mounted on a printed circuit board. An opaque material is disposed between adjacent indicator lights of the plurality of indicator lights. The opaque material is positioned and configured such that the opaque material reduces illumination of the printed circuit board by at least one indicator light of the plurality of indicator lights.

18 Claims, 10 Drawing Sheets

LIGHT BLOCKING FEATURES FOR INDICATOR LIGHTS IN AN APPLIANCE

FIELD

The present subject matter relates generally to indicator lights, such as may be used in control panels for appliances.

BACKGROUND

Appliances generally include a control panel having a plurality of buttons, keys, or other input devices. Utilizing the control panel, an appliance user can input control commands to the appliance and operate the appliance. Certain control panels include a plurality of indicator lights mounted on a printed circuit board such that the indicator lights provide visual information about the status of the appliance, such as selected cycles or options input by the user.

In some appliances, illuminating one indicator light may also unintentionally illuminate the printed circuit board, or a portion of the printed circuit board, such as a surface of the printed circuit board, proximate to the illuminated indicator light. Such unintentional illumination may be aesthetically displeasing and/or may create confusing or conflicting visual information for the user.

Accordingly, user interface assemblies that include features for preventing unintended illumination of the printed circuit board therein would be useful.

BRIEF DESCRIPTION

Aspects and advantages of the technology will be set forth in part in the following description, or may be apparent from the description, or may be learned through practice of the technology.

In an exemplary embodiment, an appliance is provided. The appliance includes a user interface assembly. The user interface assembly includes a plurality of indicator lights mounted on a printed circuit board. An opaque material is disposed between adjacent indicator lights of the plurality of indicator lights. The opaque material reduces illumination of the printed circuit board by at least one indicator light of the plurality of indicator lights.

In another exemplary embodiment, a user interface assembly for an appliance is provided. The user interface assembly includes a plurality of indicator lights mounted on a printed circuit board. An opaque material is disposed between adjacent indicator lights of the plurality of indicator lights. The opaque material reduces illumination of the printed circuit board by at least one indicator light of the plurality of indicator lights.

These and other features, aspects and advantages of the present technology will become better understood with reference to the following description and appended claims. The accompanying drawings, which are incorporated in and constitute a part of this specification, illustrate embodiments of the technology and, together with the description, serve to explain the principles of the technology.

BRIEF DESCRIPTION OF THE DRAWINGS

A full and enabling disclosure of the present technology, including the best mode thereof, directed to one of ordinary skill in the art, is set forth in the specification, which makes reference to the appended figures.

DETAILED DESCRIPTION

Figure 1:
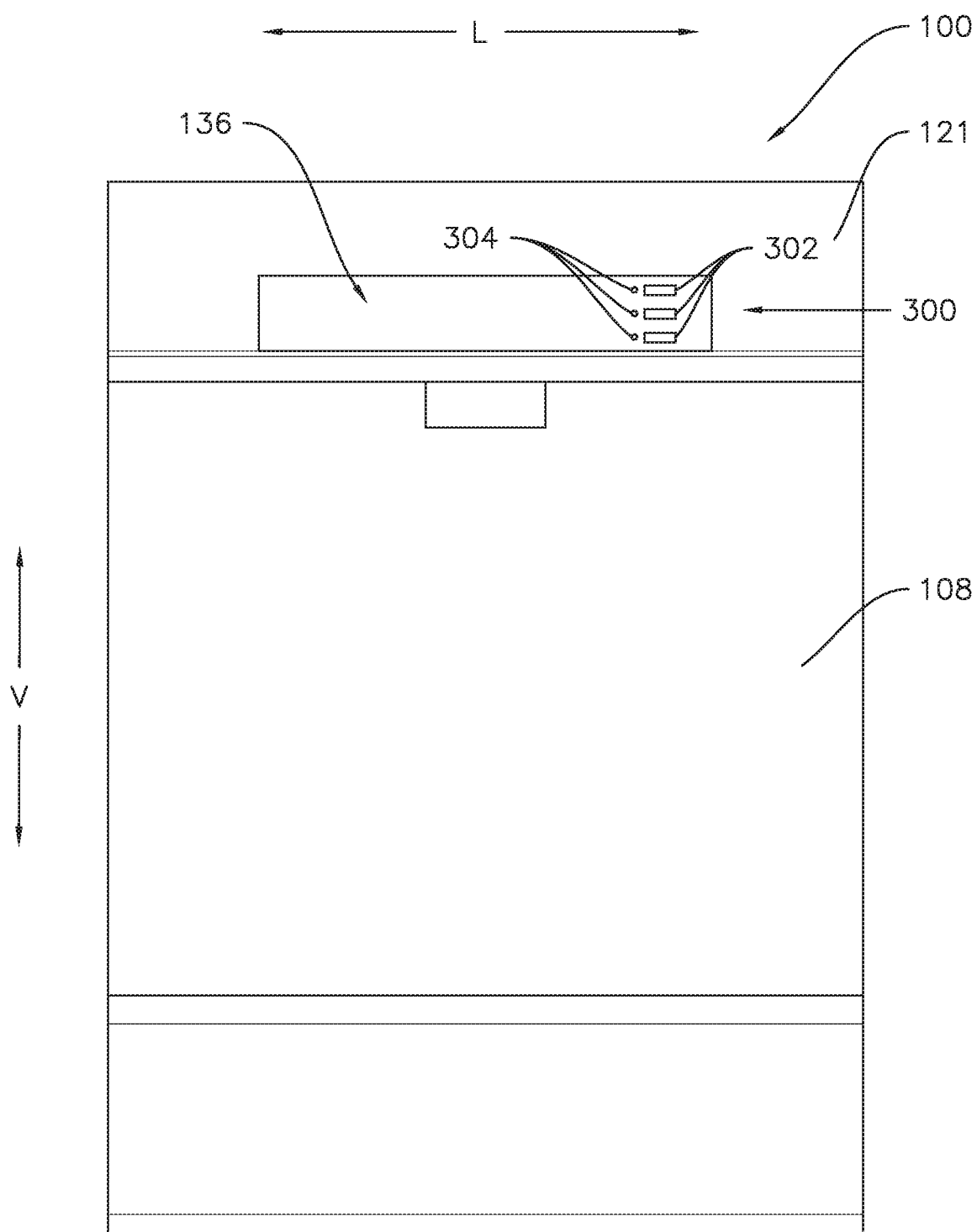
FIG. 1 provides a front view of an example dishwashing appliance as may incorporate a user interface in accordance with at least one embodiment of the present subject matter.

Reference now will be made in detail to embodiments of the technology, one or more examples of which are illustrated in the drawings. Each example is provided by way of explanation of the technology, not limitation of the technology. In fact, it will be apparent to those skilled in the art that various modifications and variations can be made in the present disclosure without departing from the scope or spirit of the invention. For instance, features illustrated or described as part of one embodiment can be used with another embodiment to yield a still further embodiment. Thus, it is intended that the present technology covers such modifications and variations as come within the scope of the appended claims and their equivalents.

As used herein, the terms "first," "second," and "third" may be used interchangeably to distinguish one component from another and are not intended to signify location or importance of the individual components. As used herein, terms of approximation such as "generally," "about," or "approximately" include values within ten percent greater or less than the stated value. When used in the context of an angle or direction, such terms include within ten degrees greater or less than the stated angle or direction, e.g., "generally vertical" includes forming an angle of up to ten degrees in any direction, e.g., clockwise or counterclockwise, with the vertical direction V.

Figure 2:
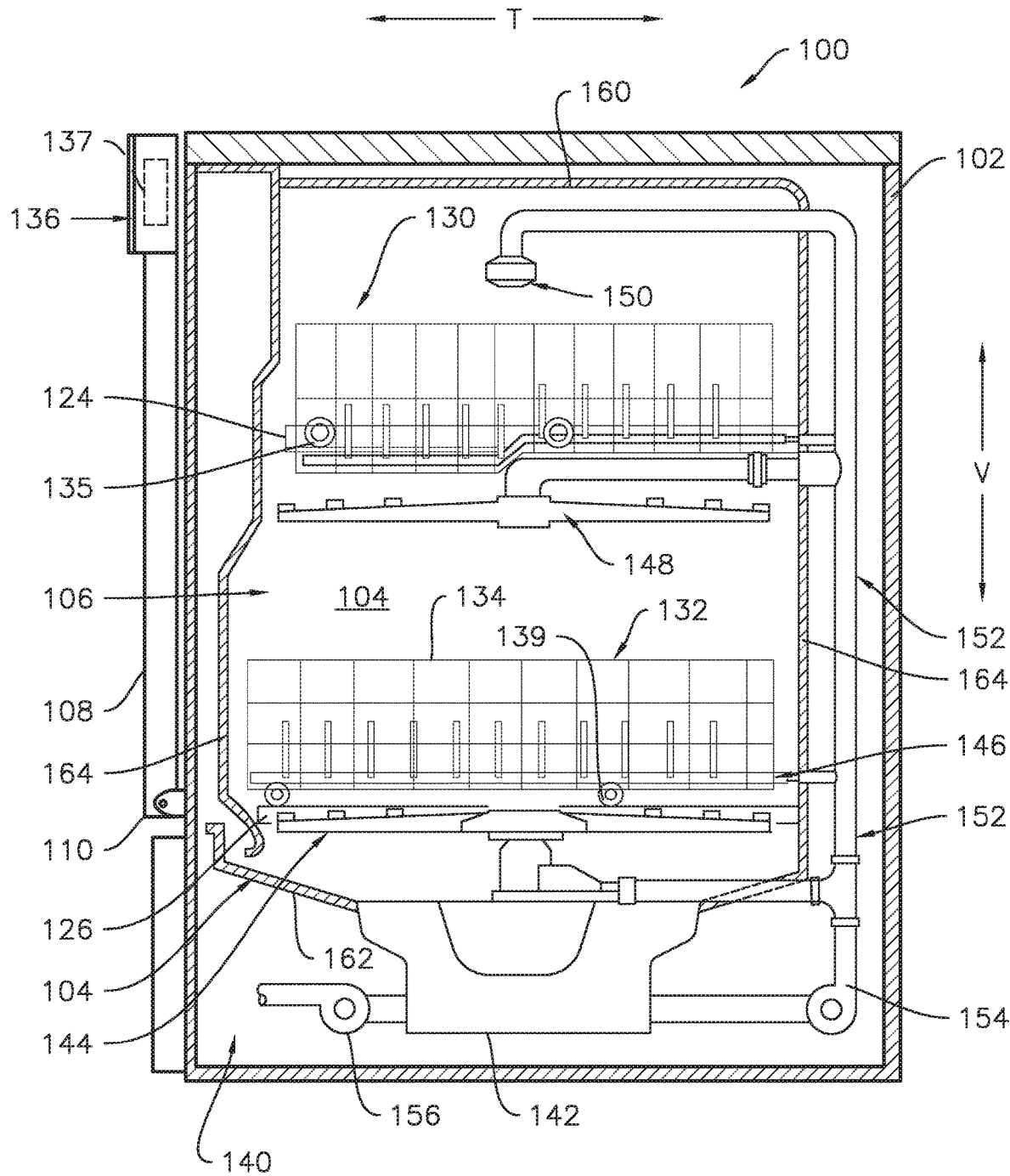
FIG. 2 provides a cross-sectional side view of the dishwashing appliance shown in FIG. 1, particularly illustrating various internal components of the dishwashing appliance.

Referring now to the drawings, FIGS. 1 and 2 illustrate one embodiment of a domestic dishwashing appliance 100 that may incorporate a user interface assembly in accordance with aspects of the present disclosure. As shown in FIGS. 1 and 2, the dishwashing appliance 100 may include a cabinet 102 having a tub 104 therein defining a wash chamber 106. The tub 104 may generally include a front opening (not shown) and a door 108 hinged at its bottom 110 for movement between a normally closed vertical position (shown in FIGS. 1 and 2), wherein the wash chamber 106 is sealed shut for washing operation, and a horizontal open position (not shown) for loading and unloading of articles from the dishwashing appliance 100.

As is understood, the tub 104 may generally have a rectangular cross-section defined by various wall panels or walls. For example, as shown in FIG. 2, the tub 104 may include a top wall 160 and a bottom wall 162 spaced apart from one another along a vertical direction V of the dishwashing appliance 100. Additionally, the tub 104 may include a plurality of sidewalls 164 (e.g., four sidewalls) extending between the top and bottom walls 160, 162. It should be appreciated that the tub 104 may generally be formed from any suitable material. However, in several embodiments, the tub 104 may be formed from a ferritic material, such as stainless steel, or a polymeric material.

As particularly shown in FIG. 2, upper and lower guide rails 124, 126 may be mounted on opposing side walls 164 of the tub 104 and may be configured to accommodate roller-equipped rack assemblies 130 and 132. Each of the rack assemblies 130, 132 may be fabricated into lattice structures including a plurality of elongated members 134 (for clarity of illustration, not all elongated members making up assemblies 130 and 132 are shown in FIG. 2). Additionally, each rack 130, 132 may be adapted for movement along a transverse direction T between an extended loading position (not shown) in which the rack is substantially positioned outside the wash chamber 106, and a retracted position (shown in FIGS. 1 and 2) in which the rack is located inside the wash chamber 106. This may be facilitated by rollers 135 and 139, for example, mounted onto racks 130 and 132, respectively. As is generally understood, a silverware basket (not shown) may be removably attached to rack assembly 132 for placement of silverware, utensils, and the like, that are otherwise too small to be accommodated by the racks 130, 132. As may be seen collectively in FIGS. 1 and 2, the dishwashing appliance 100 may define the vertical direction V, the transverse direction T, and a lateral direction L. The vertical direction V, lateral direction L, and transverse direction T are mutually perpendicular and form an orthogonal direction system.

Additionally, the dishwashing appliance 100 may also include a lower spray-arm assembly 144 that is configured to be rotatably mounted within a lower region 146 of the wash chamber 106 directly above the bottom wall 162 of the tub 104 so as to rotate in relatively close proximity to the rack assembly 132. As shown in FIG. 2, a mid-level spray-arm assembly 148 may be located in an upper region of the wash chamber 106, such as by being located in close proximity to the upper rack 130. Moreover, an upper spray assembly 150 may be located above the upper rack 130.

As is generally understood, the lower and mid-level spray-arm assemblies 144, 148 and the upper spray assembly 150 may generally form part of a fluid circulation system 152 for circulating fluid (e.g., water and dishwashing fluid, which may also include water, detergent, and/or other additives, and may be referred to as wash liquor) within the tub 104. As shown in FIG. 2, the fluid circulation system 152 may also include a recirculation pump 154 located in a machinery compartment 140 below the bottom wall 162 of the tub 104, as is generally recognized in the art, and one or more fluid conduits for circulating the fluid delivered from the pump 154 to and/or throughout the wash chamber 106. The tub 104 may include a sump 142 positioned at a bottom of the wash chamber 106 for receiving fluid from the wash chamber 106. The recirculation pump 154 receives fluid from sump 142 to provide a flow to fluid circulation system 152, which may include a switching valve or diverter (not shown) to select flow to one or more of the lower and mid-level spray-arm assemblies 144, 148 and the upper spray assembly 150.

Moreover, each spray-arm assembly 144, 148 may include an arrangement of discharge ports or orifices for directing washing liquid onto dishes or other articles located in rack assemblies 130 and 132, which may provide a rotational force by virtue of washing fluid flowing through the discharge ports. The resultant rotation of the lower spray-arm assembly 144 provides coverage of dishes and other dishwasher contents with a washing spray.

A drain pump 156 may also be provided in the machinery compartment 140 and in fluid communication with the sump 142. The drain pump 156 may be in fluid communication with an external drain (not shown) to discharge fluid, e.g., used wash liquid, from the sump 142.

The dishwashing appliance 100 may be further equipped with a controller 137 configured to regulate operation of the dishwasher 100. The controller 137 may generally include one or more memory devices and one or more microprocessors, such as one or more general or special purpose microprocessors operable to execute programming instructions or micro-control code associated with a cleaning cycle. The memory may represent random access memory such as DRAM, or read only memory such as ROM or FLASH. In one embodiment, the processor executes programming instructions stored in memory. The memory may be a separate component from the processor or may be included onboard within the processor.

The controller 137 may be positioned in a variety of locations throughout dishwashing appliance 100. In the illustrated embodiment, the controller 137 is located within a control panel area 121 of the door 108, as shown in FIG. 1. In such an embodiment, input/output ("I/O") signals may be routed between the control system and various operational components of the dishwashing appliance 100 along wiring harnesses that may be routed through the bottom of the door 108. Typically, the controller 137 includes a user interface panel/control console 136 through which a user may select various operational features and modes and monitor progress of the dishwasher 100. The user interface panel 136 may be a part of a user interface assembly 300, e.g., the user interface panel 136 may be a front panel of the user interface assembly 300. In one embodiment, the user interface panel 136 may represent a general purpose I/O ("GPIO") device or functional block. Additionally, the user interface panel 136 may include input components, such as one or more of a variety of electrical, mechanical or electro-mechanical input devices including rotary dials, push buttons, touch pads, and touch screens. The user interface panel 136 may also include a display component, such as a digital or analog display device designed to provide operational feedback to a user. For example, the user interface panel 136 may include input components such as buttons 302, examples of which are illustrated in FIG. 1 and the display component may include a plurality of indicator lights 304, with each indicator light 304 corresponding to a respective one of the buttons 302. The buttons 302 may be mechanical push buttons, capacitive touch sensors, or any other suitable type of button, including combinations of different types of buttons. As is generally understood, the user interface panel 136 may be in communication with the controller 137 via one or more signal lines or shared communication busses. It should be noted that controllers 137 as disclosed herein are capable of and may be operable to perform any methods and associated method steps as disclosed herein.

A variety of text, digits, and/or symbols may be printed on user interface panel 136 to indicate, e.g., which features or options of the appliance 100 are associated with each button 302. In at least some embodiments, one or more of the buttons 302 and associated indicator lights 304 may correspond to mutually-exclusive options. For example, in embodiments where the appliance is a dishwashing appliance, a first button 302 and a respective first indicator light 304 may correspond to an ECO mode, which minimizes water and/or energy usage, while a second button 302 and a respective second indicator light 304 may correspond to a heavy wash mode which maximizes the cleaning power applied to articles within the dishwashing appliance 100. In various embodiments, including but not limited to the foregoing example, it is generally desirable to distinguish lit indicator lights from unlit indicator lights. This is particularly true when the indicator lights correspond to mutually-exclusive options, although such is not the only case in which it is desirable to distinguish lit indicator lights from unlit indicator lights.

It should be appreciated that the present subject matter is not limited to any particular style, model, or configuration of dishwashing appliance. The exemplary embodiment depicted in FIGS. 1 and 2 is simply provided for illustrative purposes only. For example, different locations may be provided for the user interface panel 136, different configurations may be provided for the racks 130, 132, and other differences may be applied as well. Additionally, it should be appreciated that the indicator lights 302 and user interface assembly 300 described herein may be useful in a variety of household appliances, such as but not limited to a cooktop or oven appliance, a laundry appliance, and/or a refrigerator appliance, among others. It should be understood that the present disclosure is not limited to the above-described user interface panel 136, embodiments of the present disclosure may be used with any suitable control assembly having more than one indicator light. Furthermore, it should be understood that the descriptions herein of an appliance are but one example of a possible field of use for the indicator lights.

Figure 3:
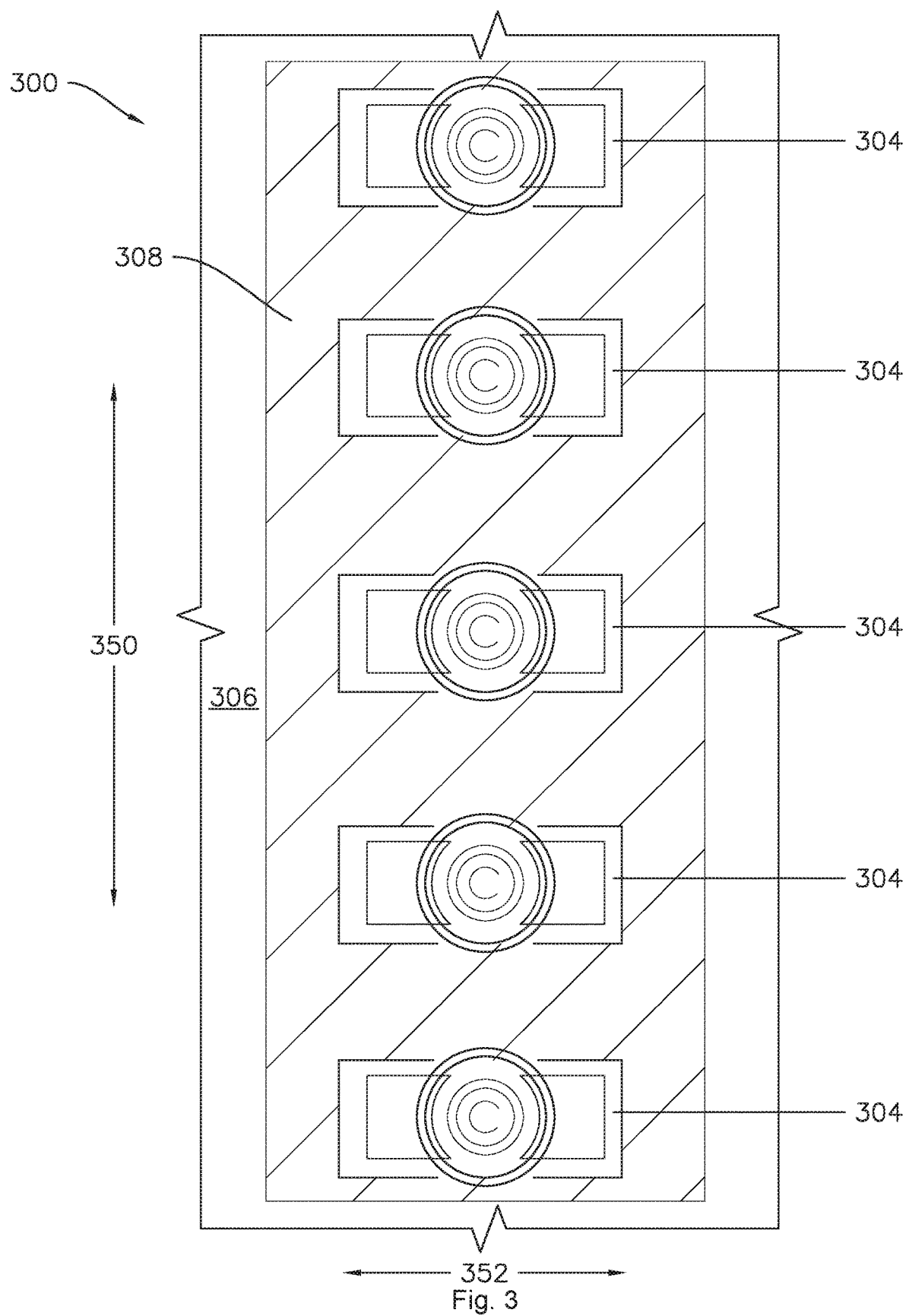
FIG. 3 provides a front view of a user interface assembly according to at least one embodiment of the present subject matter.
Figure 4:
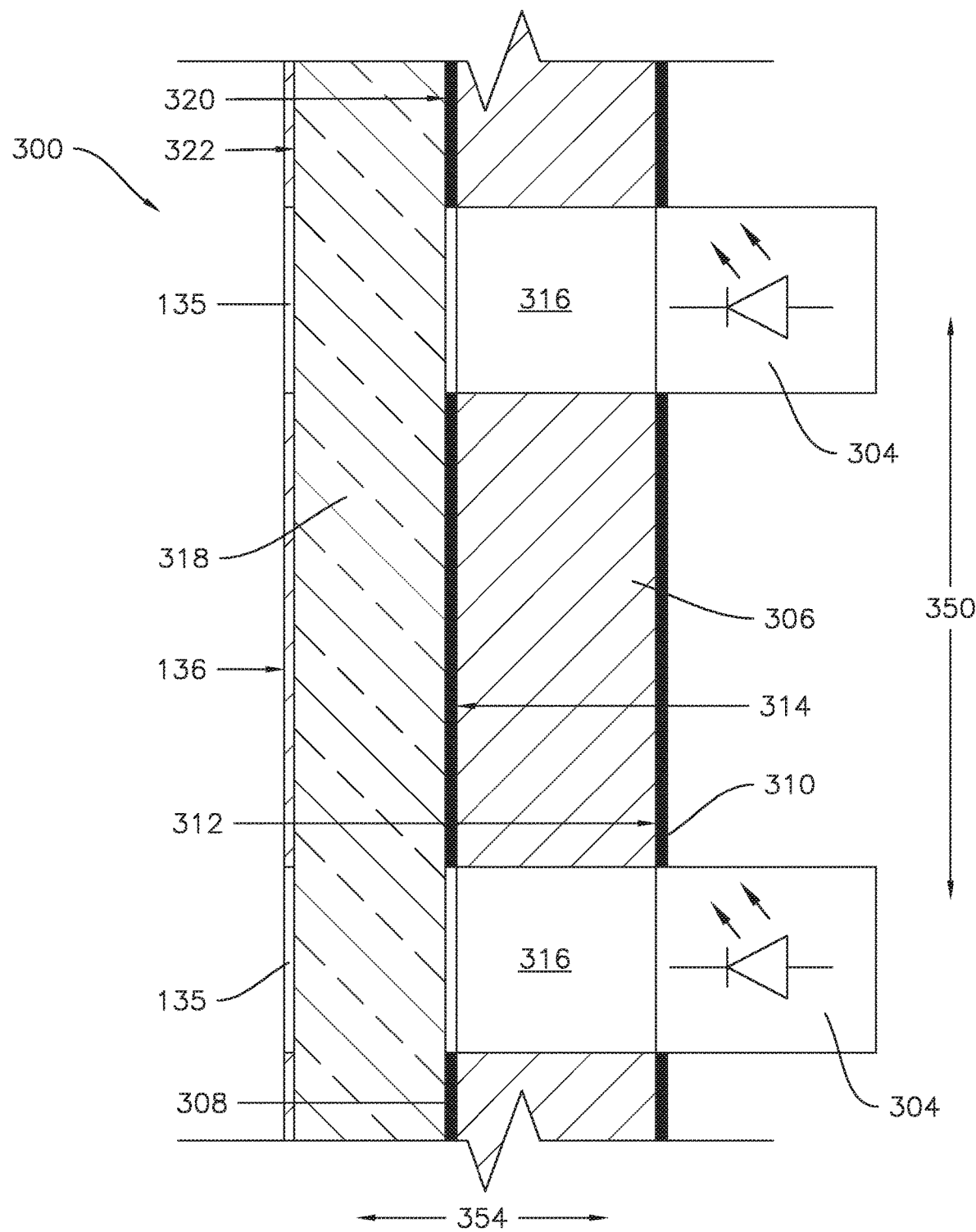
FIG. 4 provides a side, section view of a portion of the user interface assembly of FIG. 3.

Turning now to FIGS. 3 and 4, a plurality of indicator lights 304, which are light-emitting diodes (LEDs) in the illustrated embodiment, are illustrated mounted on a printed circuit board 306. In the exemplary embodiment illustrated in FIG. 3, the plurality of indicator lights 304 includes five indicator lights 304. In various embodiments, the plurality of indicator lights 304 may include any suitable number of indicator lights 304, such as three indicator lights 304 as illustrated in FIG. 1, or two indicator lights 304 in other embodiments, or four indicator lights 304, or more indicator lights 304 in still further embodiments.

As may be seen in FIGS. 3 and 4, the user interface assembly 300 generally defines a first direction 350, a second direction 352, and a third direction 354, where the first direction 350, second direction 352, and third direction 354 are mutually perpendicular. The directions or axes 350, 352, and 354 defined by the user interface assembly 300 may be generally aligned with the vertical, lateral, and transverse directions V, L, and T defined by the appliance 100. For example, as illustrated in FIGS. 1 and 2, the user interface assembly 300 may be positioned on a front of the appliance 100 and may face forward, such that the first direction 350 is generally aligned with the vertical direction V, the second direction 352 is generally aligned with the lateral direction L, and the third direction 354 is generally aligned with the transverse direction T. In other embodiments, the user interface assembly 300 may face upwards, e.g., such that the first direction 350 is generally aligned with one of the lateral direction L or the transverse direction T, the second direction 352 is generally aligned with the other of the lateral direction L or the transverse direction T, and the third direction 354 is generally aligned with the vertical direction V. Other alignments and orientations of the user interface assembly 300 are also possible, for example, the user interface assembly 300 may be oblique to some or all of the vertical, lateral, and transverse directions V, L, and T, e.g., the user interface assembly 300 may form an angle of at least about fifteen degrees (15°) with at least one of the vertical, lateral, and transverse directions V, L, and T. For example, the user interface assembly 300 may be generally aligned with the lateral direction L while forming an angle of between about fifteen degrees (15°) and about sixty degrees (60°), such as about forty-five degrees (45°), with each of the vertical and transverse directions V and T. Such examples may apply, e.g., when the user interface assembly 300 is disposed on a backsplash of an oven appliance or a laundry appliance.

The indicator lights 304 may be disposed on the printed circuit board 306 in a linear array. For example, the indicator lights 304 may be aligned along one direction, e.g., the second direction 352 as illustrated in FIG. 3, and spaced apart along another direction, e.g., the first direction 350 as illustrated in FIG. 3. The array of indicator lights 304 may also be aligned along, e.g., the third direction 354, as illustrated for example in FIG. 4.

In at least some embodiments, the spacing of adjacent indicator lights 304 of the plurality of indicator lights 304 may be less than a light radius of each indicator light 304. For example, each indicator light 304 may be sized and configured (e.g., based on a light intensity or luminosity of each light 304) to illuminate a certain area, which may be a generally circular area, and the light radius of each indicator light 304 may be a radius of the illuminated area (in the case of a circular illuminated area) and/or one-half of a major dimension of the illuminated area. For example, it may be desirable to minimize the overall size of the user interface assembly 300 relative to the size of the appliance 100. Thus, the indicator lights 304 may be relatively closely spaced, e.g., the space between adjacent indicator lights 304 may be less than the light radius of each indicator light 304. In such embodiments, lighting or activating one indicator light 304 may also incidentally and/or unintentionally illuminate (at least partially) the printed circuit board 306 at or near an adjacent indicator light 304, creating an unintended appearance that the adjacent indicator light 304 is also illuminated. For example, in some embodiments, the indicator lights 304 may be reverse-mounted on the printed circuit board 306, e.g., as illustrated in FIG. 4. In such embodiments, each indicator light 304 may be associated with (e.g., aligned with, such as along the first direction 350 and the second direction 353, such that light from the indicator light 304 shines through the associated aperture 316) an aperture 316 in the printed circuit board 306. It should be understood that the aperture 316 is associated with the corresponding indicator light 304 such that light from the indicator light 304 shines through the associated aperture 316 when the indicator light 304 is lit. Moreover, in at least some embodiments, there is a one-to-one correspondence or association of indicator lights 304 and 316, e.g., where each indicator light 304 is positioned and configured to directly illuminate a single aperture 316 and only the single aperture 316.

The user interface panel 136 may be opaque and may, as mentioned above, have a variety of text, digits, and/or symbols printed thereon. Further, the user interface panel 136 may include a plurality of apertures 135 and each aperture 135 of the plurality of apertures may be associated with a corresponding aperture 316 in the printed circuit board 306 and indicator light 304. It should be understood that the apertures 135 in the user interface panel 136 may be "associated with" the aperture 316 and indicator lights 304 in the same sense that the apertures 316 are associated with each respective indicator light 304, as described above.

Where the printed circuit board 306 is generally translucent, light from one indicator light 304 may also travel through the printed circuit board 306 and illuminate an outer surface of the printed circuit board 306 proximate an adjacent indicator light 304, such as through the printed circuit board 306 from the aperture 316 associated with the one indicator light 304. Such light travelling through the printed circuit board 306 may result in light bleed, e.g., where the adjacent indicator light 304 appears to be illuminated due to the unintentional or secondary illumination of the area of the printed circuit board 306 around the adjacent indicator light 304 when the one indicator light 304 is lit. This light bleed may be perceptible by a user of the appliance 100 as a green or greenish glow, e.g., where the printed circuit board 306 is typically green in color, the printed circuit board 306 may impart a greenish glow to the light that travels through the printed circuit board 306. The user interface assembly 300 includes features which prevent or limit such light travelling through the printed circuit board 306 from reaching one or more apertures 316 associated with unlit indicator lights 304.

Figure 5:
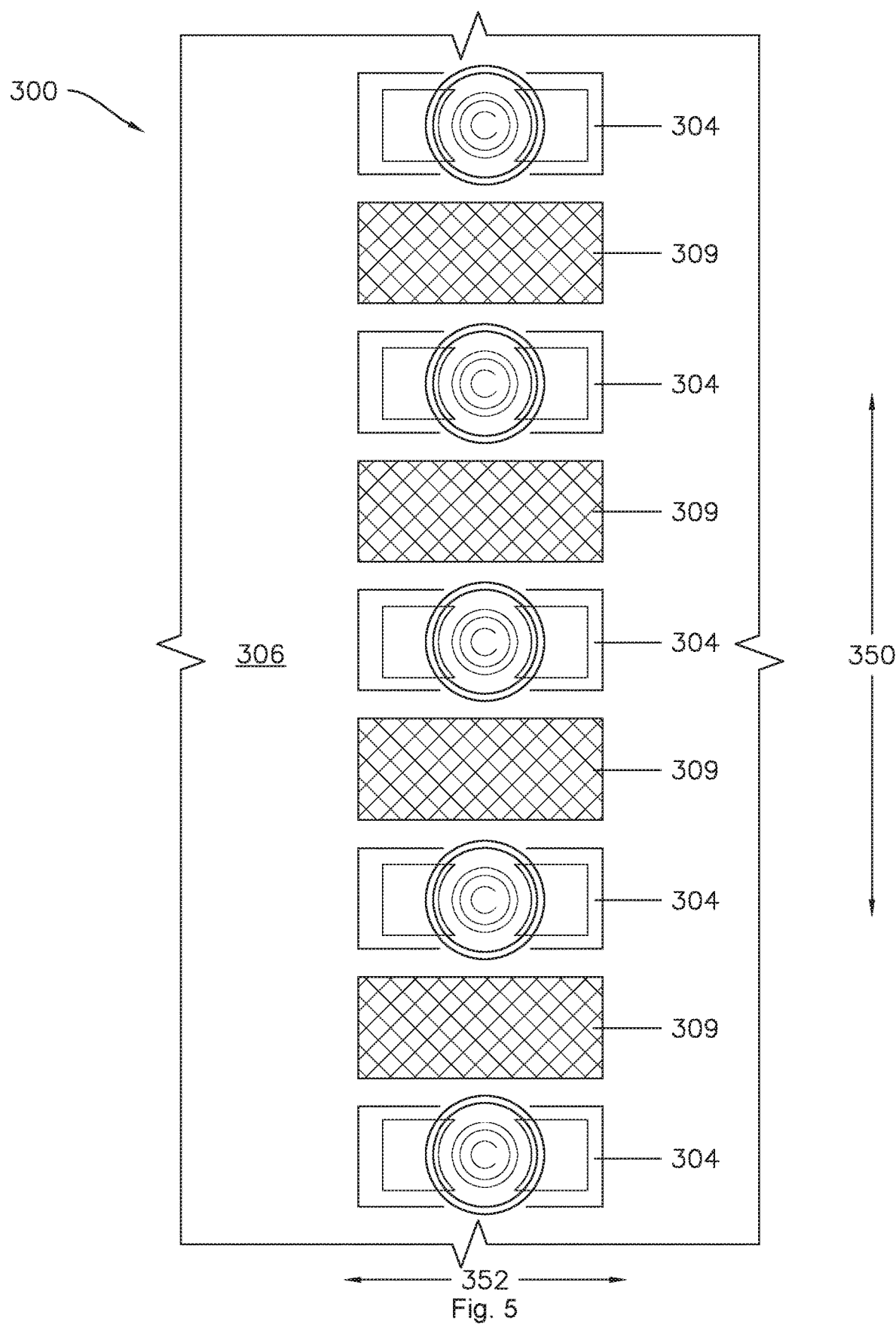
FIG. 5 provides a front view of a user interface assembly according to at least one additional embodiment of the present subject matter.
Figure 6:
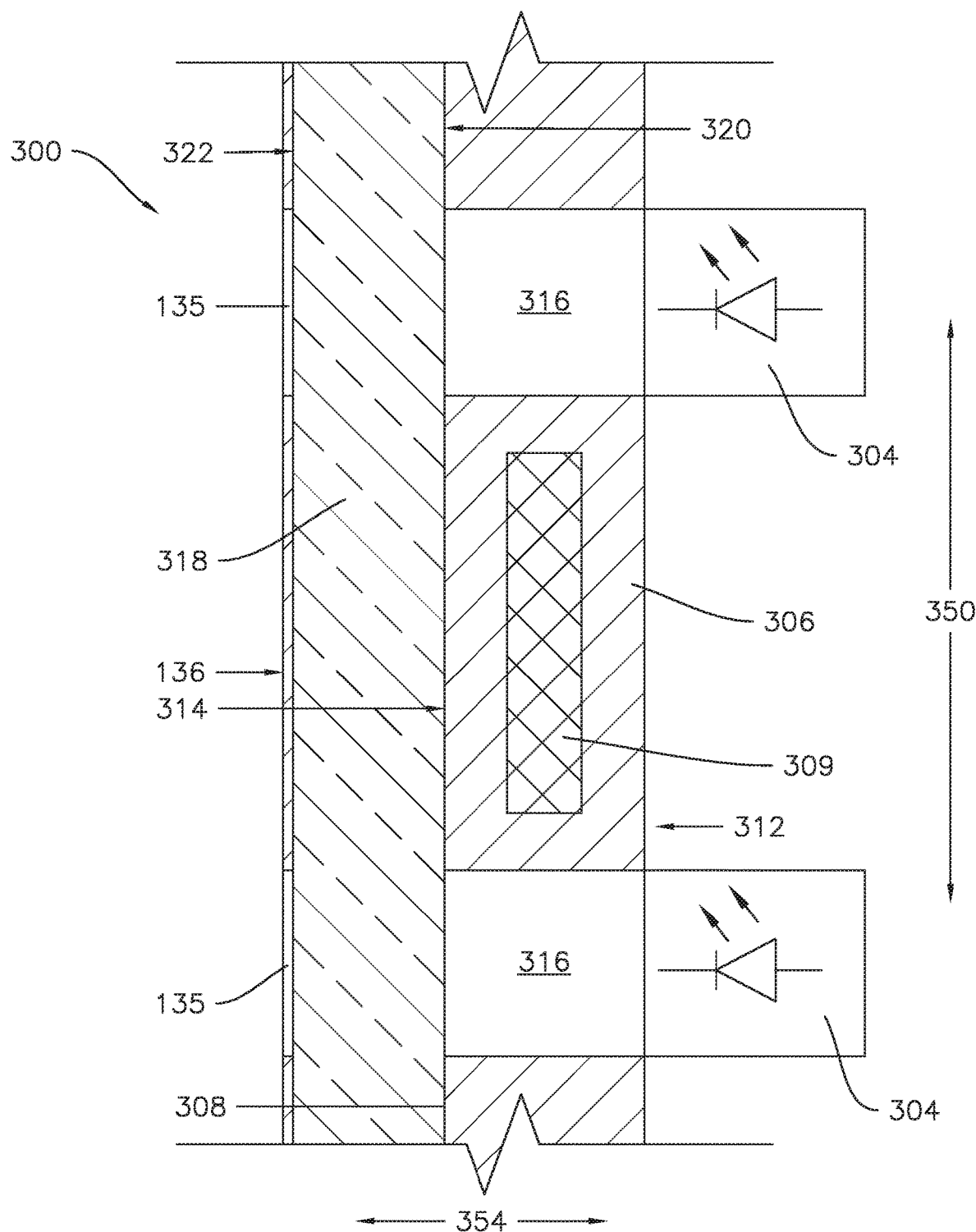
FIG. 6 provides a side, section view of a portion of the user interface assembly of FIG. 5.

In various embodiments, an opaque material may be provided on or within the printed circuit board 306 between adjacent indicator lights 304 of the plurality of indicator lights 304 and/or between the respective apertures 316 associated with the adjacent indicator lights 304. In some embodiments, the opaque material 308 may be a copper pour or a layer of ink, e.g., silk screened ink, and may surround each indicator light 304 and/or each aperture 316 (e.g., FIG. 4) associated with the indicator lights 304. The opaque material 308 may thereby optically separate or isolate the adjacent indicator lights 304 from each other such that light bleed, e.g., illumination of or through the printed circuit board 306 which appears to originate from an unlit indicator light 304, is avoided (e.g., prevented) or minimized (e.g., reduced). The opaque material may reduce illumination of the printed circuit board 306 by at least one indicator light 304 of the plurality of indicator lights 304. For example, the at least one indicator light 304 may be a lit indicator light 304 and the opaque material 308 may reduce or prevent light originating from the lit indicator light 304 from illuminating the printed circuit board 306 at or near the aperture 316 associated with an unlit indicator light 304 adjacent the lit indicator light 304. In some embodiments, e.g., as illustrated in FIGS. 3 and 4, the opaque material 308, 310 may be disposed on one or more external surfaces 312 and/or 314 of the printed circuit board 306. For example, in embodiments where the opaque material 308 is a copper pour, the copper pour 308, 310 may be formed directly on the external surfaces 312 and/or 314. In other example embodiments where the opaque material 308, 310 is ink, the opaque material may comprise one or more layers of ink printed onto the external surfaces 312 and/or 314 by silk screen. In such embodiments, the silk screened ink is preferably a dark color for maximum light obstruction, such as black. Additionally, combinations of the foregoing are also possible, e.g., the opaque material 308 and/or 310 may include both a copper pour and at least one layer of silk screened ink, one directly on the external surfaces 312 and/or 314 and the other on top of the one directly on the external surface 312 and/or 314. In other embodiments, e.g., as illustrated in FIGS. 5 and 6, an internal opaque material may be provided, e.g., the opaque material may be a copper pour 309 disposed within the printed circuit board 306. The copper pour 309 may limit (e.g., reduce) or obstruct (e.g., prevent) light travelling from a lit indicator light 304 (and/or the aperture 316 associated with the lit indicator light 304) from illuminating the printed circuit board 306 proximate to an adjacent, unlit indicator light 304, thereby preventing or minimizing (e.g., reducing) light bleed, e.g., user-perceptible illumination (glow) at or near the unlit indicator light 304.

As mentioned above, the indicator lights 304 may be reverse mounted on the printed circuit board 306. As maybe seen in FIGS. 4 and 6, the printed circuit board may be defined by and extend between a front surface 314 and a back surface 312 along the third direction 354. The indicator lights 304 may be mounted on or to the back surface 312 of the printed circuit board 306, e.g., the indicator lights 304 may be reverse mounted on the printed circuit board 306.

The user interface assembly 300 may also include a translucent panel or lens 318. The lens 318 may be disposed between the printed circuit board 306 and the user interface panel 136, e.g., along the third direction 354 as illustrated in FIGS. 4 and 6. For example, in at least some embodiments, the lens 318 may be defined by and extend between a back surface 320 and a front surface 322 along the third direction 354. In some such embodiments, the back surface 320 of the lens 318 may abut the front surface 314 of the printed circuit board 306 and the front surface 322 of the lens 318 may abut an inner surface or back surface of the user interface panel 136. Additionally, in some embodiments, the user interface assembly 300 may include one or more capacitive touch features, for example, one or more of the inputs or buttons 302 may be or include capacitive touch sensors. In embodiments which include such capacitive touch features, the lens 318 may also be a dielectric panel. For example, the printed circuit board 306 may include one or more capacitive touch sensors embedded thereon, and the lens or panel 318 may comprise a dielectric material such that the lens 318 provides a dielectric panel for the capacitive touch sensor(s). For example, as is generally understood by those of skill in the art, the printed circuit board 306 may include an electrode, e.g., a ground pour of the printed circuit board 306, and a sensor pad or pads disposed on the printed circuit board 306. Accordingly, the user interface panel 136 may be responsive to a touch from a user, e.g., on an exterior surface thereof, by sensing or measuring a change in capacitance at the printed circuit board 306 due to the presence of, e.g., the user's finger on the exterior surface. In various embodiments, the capacitive touch sensor may operate on self capacitance, mutual capacitance, or combinations thereof and/or any other suitable configuration. The structure and function of such capacitive touch sensors are generally understood by those of skill in the art and, as such, are not shown or described in greater detail herein.

In at least some embodiments where the opaque material 308 or 310 is a copper pour, and/or where the internal copper pour 309 is provided, the copper pour 308, 309, and/or 310 does not form a part of or connect to an electrical component on the printed circuit board 306. For example, the copper pour 308, 309, and/or 310 may be electrically isolated from any circuits in the printed circuit board 306. For example, the copper pour 308, 309, and/or 310 may be separate from and in addition to other copper pours on the printed circuit board 306 which form part of, e.g., the ground pour described above, the buttons 302, or other components which may typically be formed on a printed circuit board, as will be understood by those of skill in the art.

In some embodiments, as illustrated in FIGS. 3 and 4, the opaque material 308 may be disposed on the front surface 314 of the printed circuit board 306. In such embodiments, a second opaque material 310 may also or instead be provided on the back surface 312 of the printed circuit board 306. As mentioned above, the external opaque material 308 on the front exterior surface 314 may be either a copper pour or a silk screen. Similarly, the second external opaque material 310 on the back exterior surface 312 may be either a copper pour or a silk screen. Various combinations of the foregoing are possible, e.g., when both external opaque materials 308 and 310 are provided, one may be a copper pour while the other may be a silk screen, or both opaque materials 308 and 310 may be the same, e.g., both 308 and 310 may be a copper pour or both 308 and 310 may be a silk screen. In some embodiments, the opaque material 308 and/or 310 may be disposed between and around the indicator lights 304 and/or the associated apertures 316, e.g., the opaque material 308 and/or 310 may completely surround at least one of the indicator lights 304 and/or the associated apertures 316 on all sides, such as all internal indicator lights 304 within the array of indicator lights may be surrounded by the opaque material 308 and/or 310 on all sides, such as all of the indicator lights 304 may be surrounded by the opaque material 308 and/or 310 on all sides.

In some embodiments, e.g., as illustrated in FIGS. 5 and 6, the opaque material of the user interface assembly 300 may include a copper pour 309 defined between each pair of adjacent indicator lights 304. In some embodiments, the copper pour 309 may be provided only between adjacent indicator lights 304 of the plurality of indicator lights 304, such as only between the adjacent indicator lights 304 along a single direction, e.g., the first direction 350. As may be seen in FIGS. 5 and 6, the copper pour 309 may be aligned with the indicator lights 304, e.g., along the second direction 352, and may be at least coextensive with the indicator lights 304 along the second direction 352. In some embodiments, e.g., as illustrated in FIG. 6, the copper pour 309 may be disposed within the printed circuit board 306, e.g., between the front surface 314 and the back surface 312 along the third direction 354, such that the copper pour 309 provides an internal opaque material (e.g., internal to the printed circuit board 306).

As mentioned above, features illustrated or described as part of one embodiment can be used with another embodiment to yield a still further embodiment. For example, an external opaque material 308 (e.g., as illustrated in FIG. 4) may be provided only between adjacent indicator lights 304 (e.g., as illustrated in FIG. 5), or, as another example, an internal copper pour 309 (e.g., as illustrated in FIG. 6) may surround at least one, up to and including all, of the indicator lights 304 (e.g., as illustrated in FIG. 3). As another example, both the internal opaque material 309 of FIGS. 5 and 6 and the external opaque material 308 and/or 310 of FIGS. 3 and 4 may be provided in combination. In such combined embodiments, the external opaque material 308 and/or 310 may be a copper pour, a silk screen, or combinations thereof.

Figure 8:
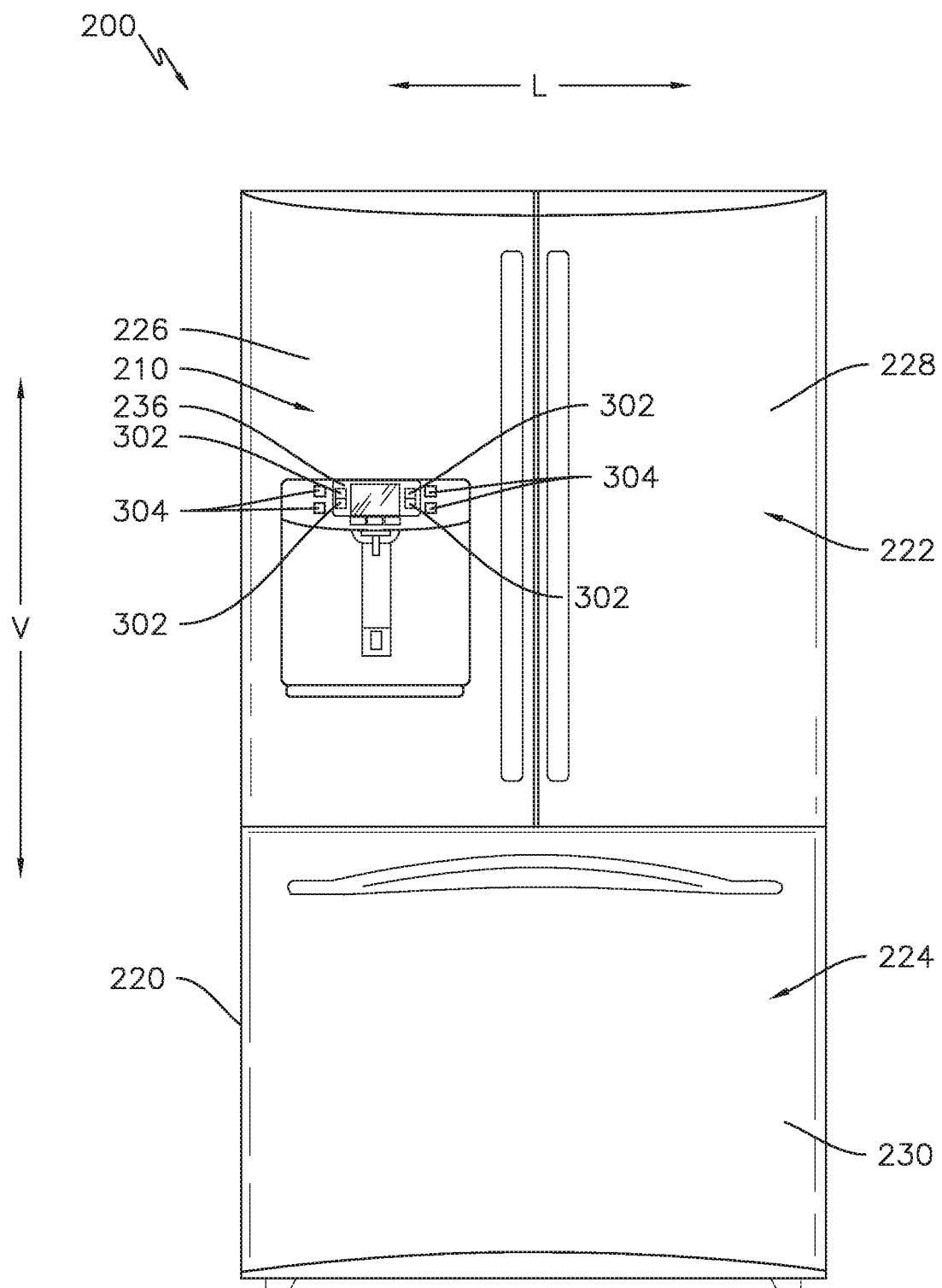
FIG. 8 provides a front, elevation view of a refrigerator appliance as may incorporate a user interface assembly according to at least one further embodiment of the present subject matter.
Figure 9:
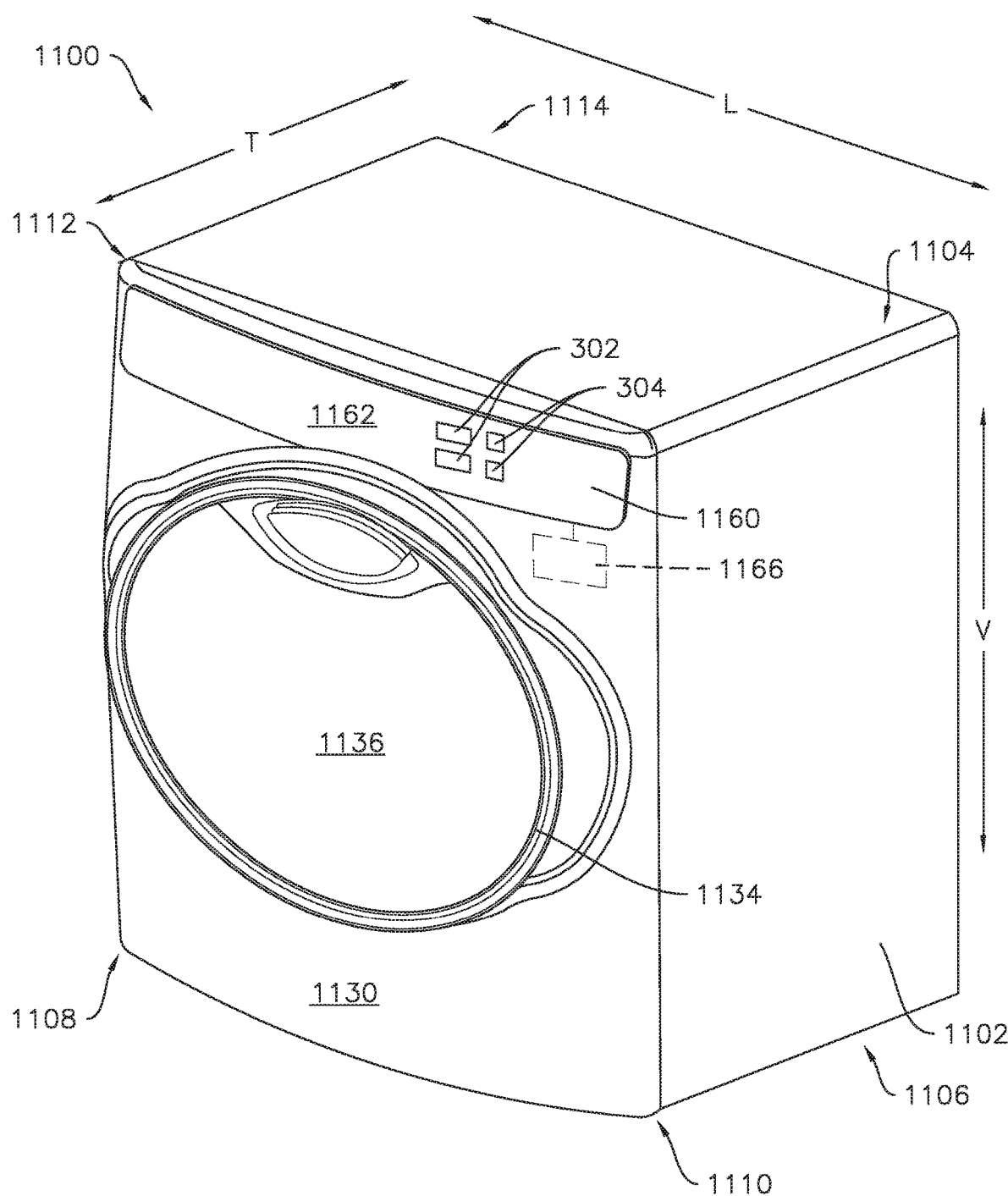
FIG. 9 provides a perspective view of a washing machine appliance as may incorporate a user interface assembly in accordance with at least one still further embodiment of the present subject matter.
Figure 10:
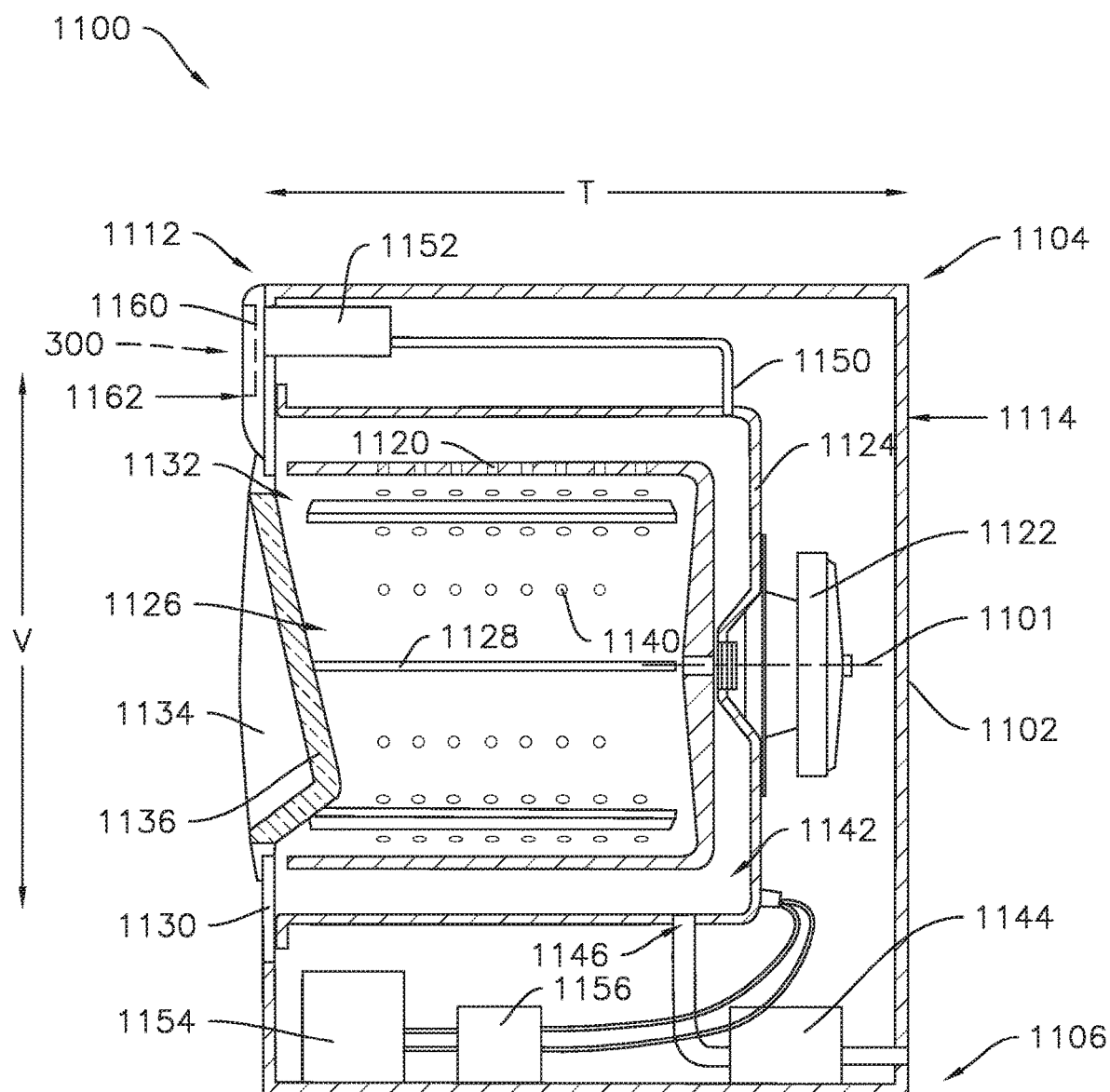
FIG. 10 provides a side cross-sectional view of the exemplary washing machine appliance of FIG. 9.

As mentioned above, user interface assembly 300 may be used with any suitable appliance. For example, such suitable appliance may be a cooktop appliance, as illustrated in FIG. 7, a refrigerator appliance, as illustrated in FIG. 8, or a laundry appliance, as illustrated in FIGS. 9 and 10, among other possible examples.

Figure 7:
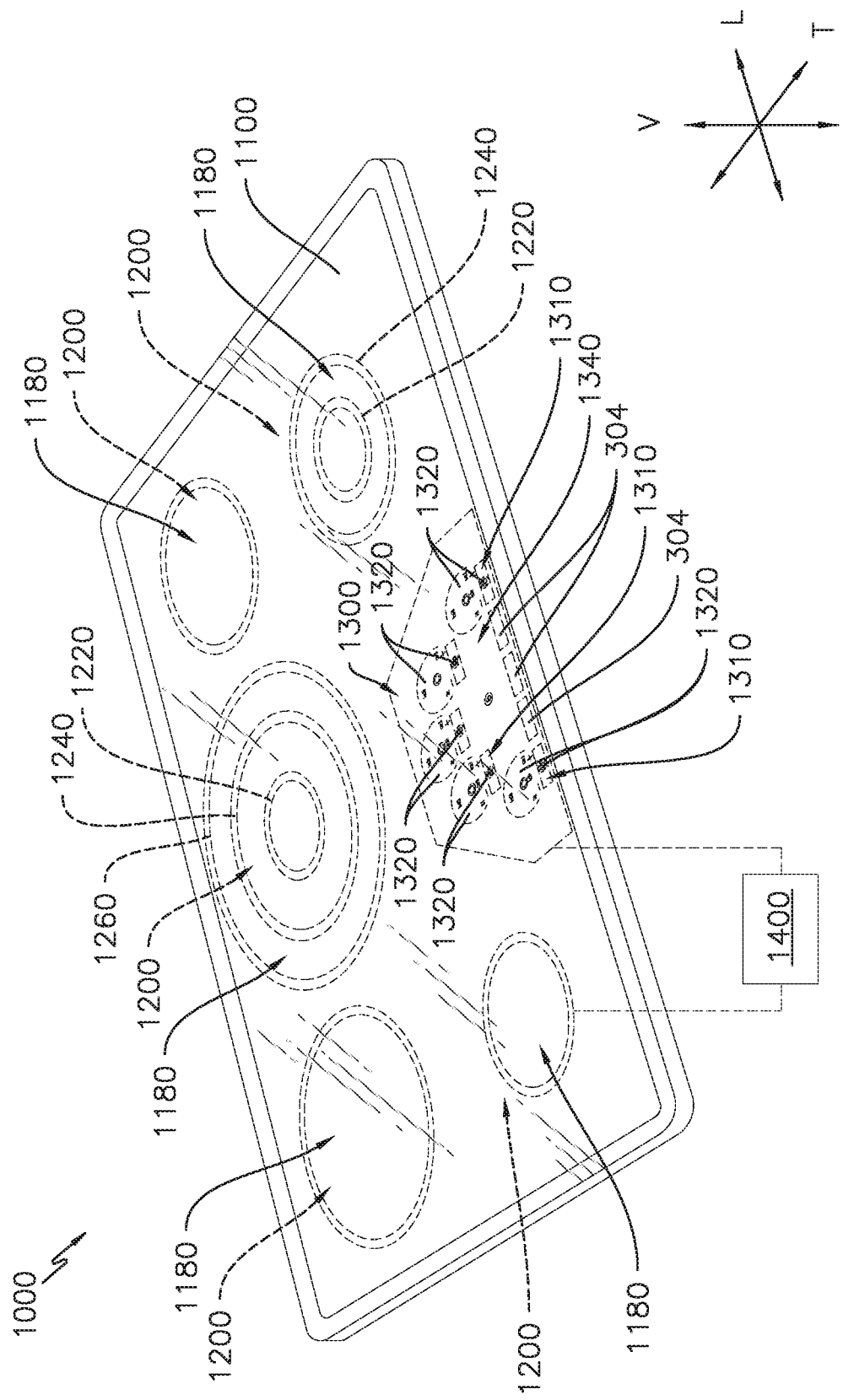
FIG. 7 provides a top perspective view of an example cooktop appliance as may incorporate a user interface assembly in accordance with at least one additional embodiment of the present subject matter.

FIG. 7 provides a top, perspective view of a cooktop appliance 1000 according to an exemplary embodiment of the present subject matter. Cooktop appliance 1000 can be installed in various locations such as in cabinetry in a kitchen, with one or more ovens to form a range appliance, or as a standalone appliance. Thus, as used herein, the term "cooktop appliance" includes grill appliances, stove appliances, range appliances, and other appliances that incorporate cooktops, which are generally known as surface cooking appliances. It should be understood that the present disclosure is not limited to cooktop appliances 1000, and rather that any suitable appliance having a user input assembly is within the scope and spirit of the present disclosure.

Cooktop appliance 1000 includes a cooking panel 1100 for supporting cooking utensils such as pots or pans thereon. Cooking panel 1100 is a generally transparent material that may be constructed from, e.g., glass, ceramics, and/or combinations thereof.

Cooking panel 1100 may include one or more cooking zones 1180. As shown in FIG. 7, cooking zones 1180 may be generally circular in shape and may have various diameters. For example, each cooking zone 1180 can have a different diameter, the same diameter, or any suitable combination thereof. In other embodiments, cooking zones 1180 may be generally rectangular in shape, and each cooking zone 1180 may have the same length and width, a different length and width, or any suitable combination thereof. In still other embodiments, cooking zones 1180 may have any suitable shape and size, and in some embodiments, cooking panel 1100 may include cooking zones 1180 of various shapes and sizes, e.g., a combination of circular and rectangular cooking zones 1180. Further, while shown with five cooking zones 1180 in the exemplary embodiment of FIG. 7, in alternative exemplary embodiments, cooktop appliance 1000 may include any number of cooking zones 1180.

A heating assembly 1200 is mounted below cooking panel 1100 adjacent each cooking zone 1180 such that heating assemblies 1200 are positioned below cooking panel 1100, e.g., along a vertical direction V. Each heating assembly 1200 may comprise a single heating element or a plurality of heating elements or sub-elements, such as a first heating element 1220, a second heating element 1240, and/or a third heating element 1260 as shown in FIG. 7, with each heating element or sub-element contributing to the power density of the respective cooking zone 1180. For each heating assembly having more than one heating element, heating elements 1220, 1240, and/or 1260 may be activated individually or in conjunction with one or both of the other heating elements 1220, 1240, 1260. For example, for a given heating assembly 1200, first heating element 1220 may be activated individually, with second heating element 1240, with third heating element 1260, or with both second heating element 1240 and third heating element 1260. As an additional example, for a heating assembly 1200 comprising two heating elements, such as first heating element 1220 and second heating element 1240, both heating elements 1220, 1240 may be activated individually or simultaneously. Thus, using heating assemblies 1200 having multiple heating elements, cooking zones 1180 may vary in size and/or power density.

Cooktop appliance 1000 is provided by way of example only and is not limited to the exemplary embodiment shown in FIG. 7. For example, a cooktop appliance having one or more heating assemblies in combination with one or more electric or gas burner heating elements can be provided. In addition, various combinations of number of heating assemblies, position of heating assemblies, and/or size of heating assemblies can be provided. Moreover, heating assemblies 1200 can have a variety of constructions for the input of energy in the form of heat to the cooking utensils. For example, heating assemblies 1200 can be constructed as electric radiant or gas-on-glass heating sources. Mechanisms associated with each such type of heating source are positioned under cooking panel 1100 adjacent cooking zones 1180 and will be well understood by one of skill in the art using the teachings disclosed herein.

A touch pad or touch screen 1300 provides visual information to a user and allows a user to select various options for the operation of cooktop appliance 1000, e.g., including providing visual information in the form of selective illumination of one or more indicator lights 304. For example, touch screen 1300 may include a selection portion 1310 for each cooking zone 1180, and within selection portion 1310, a user may select which heating element or elements of the associated heating assembly 1200 the user desires to be activated and information may be displayed to the user such as, e.g., which heating element or elements is active and/or at what size or power density has been selected for cooking zone 1180. The selection portion 1310 may include one or more user input components, and such user input components may comprise an embodiment of the buttons 302 described herein. More particularly, as shown in the exemplary embodiment of FIG. 7, the user input component(s) of touch screen 1300 may be one or more capacitive touch input components 1320, which can be used as part of a capacitive touch sensing system to allow for the selective activation, adjustment, or control of any or all heating assemblies 1200. Touch input components 1320 may also be provided for the selective activation, adjustment, or control of any timer features or other user adjustable inputs. One or more of a variety of electrical, mechanical or electro-mechanical input devices including rotary dials, push buttons, toggle/rocker switches, and/or touch pads can also be used singularly or in combination with touch input components 1320. Touch screen 1300 also includes a display component 1340, such as a digital or analog display device designed to provide operational feedback to a user. Selection portion 1310 of touch screen 1300 is further described below.

Touch screen 1300 can be any type of input device and can have any configuration. In FIG. 7, touch screen 1300 is located within a portion of cooking panel 1100. Alternatively, touch screen 1300 can be positioned on a vertical surface near a front side of cooktop appliance 1000 or anywhere convenient for a user to access during operation of cooktop appliance 1000. In some embodiments, cooktop appliance 1000 may be a range cooktop, and in such embodiments, touch screen 1300 may be positioned on, e.g., a backsplash of the range.

Operation of cooktop appliance 1000 can be regulated by a controller 1400 that is operatively coupled, i.e., in communication with, touch screen 130 and heating assemblies 1200, including first heating elements 1220, second heating elements 1240, and third heating elements 1260. For example, in response to user manipulation of a touch input component 1320, the controller operates one of heating assemblies 1200, e.g., by operating one or more of heating elements 1220, 1240, 1260. The controller is also provided with other features. By way of example, the controller may include a memory and one or more processing devices such as microprocessors, CPUs or the like, such as general or special purpose microprocessors operable to execute programming instructions or micro-control code associated with operation of appliance 1000. The memory may represent random access memory such as DRAM, or read only memory such as ROM or FLASH. The memory may be a separate component from the processor or may be included onboard within the processor. In one embodiment, the processor executes programming instructions stored in memory. It should be noted that controllers 1400 as disclosed herein are capable of and may be operable to perform any methods and associated method steps as disclosed herein. For example, in some embodiment, methods disclosed herein may be embodied in programming instructions stored in the memory and executed by the controller 1400.

The controller 1400 may be positioned in a variety of locations throughout cooktop appliance 1000. In the illustrated embodiment, the controller may be located under or next to the touch screen 1300. In such an embodiment, input/output ("I/O") signals are routed between the controller and various operational components of appliance 1000 such heating assemblies 1200, touch input components 1320, sensors, graphical displays, and/or one or more alarms. In one embodiment, the touch screen 1300 may represent a general purpose I/O ("GPIO") device or functional block. Touch screen 1300 may be in communication with the controller via one or more signal lines or shared communication busses.

FIG. 8 provides a front, elevation view of a refrigerator appliance 200 which may include a plurality of inputs 302 and associated indicator lights 304 according to an exemplary embodiment of the present subject matter. Refrigerator appliance 200 defines a vertical direction V and a lateral direction L perpendicular to the vertical direction V.

Refrigerator appliance 200 includes a cabinet or housing 220 that defines chilled chambers for receipt of food items for storage. In particular, refrigerator appliance 200 defines fresh food chamber 222 and a freezer chamber 224 arranged below fresh food chamber 222 along the vertical direction V. As such, refrigerator appliance 200 is generally referred to as a bottom mount refrigerator appliance. However, using the teachings disclosed herein, one of skill in the art will understand that the present subject matter may be used with other types of refrigerator appliances (e.g., side-by-side style or top mount style) or a freezer appliance as well. Consequently, the description set forth herein is for illustrative purposes only and is not intended to limit the present subject matter to any particular style of refrigerator appliance or arrangement of chilled chambers.

Refrigerator doors 226 and 228 are rotatably hinged to an edge of housing 220 for accessing fresh food compartment 222. A freezer door 230 is arranged below refrigerator doors 226 and 228 for accessing freezer chamber 224. Freezer door 230 is coupled to a freezer drawer (not shown) slidably mounted within freezer chamber 224.

Refrigerator appliance 200 also includes a dispensing assembly 210 for dispensing water and/or ice. Dispensing assembly 210 includes a user interface assembly 300 for controlling the mode of operation. For example, user interface assembly 300 includes a plurality of buttons 302 and a corresponding plurality of indicator lights 304. The plurality of buttons 302 may include, for example a water dispensing button (not specifically labeled) and an ice-dispensing button (not specifically labeled) for selecting a desired mode of operation such as crushed or non-crushed ice (crushed or non-crushed ice being examples of mutually exclusive options, as described above, where it may be particularly desirable to avoid simultaneous illumination of both mutually exclusive options, e.g., both crushed and non-crushed ice).

Operation of the refrigerator appliance 200 can be regulated by a controller (not shown in FIG. 8) that is operatively coupled to user interface assembly 300. The controller may be positioned in a variety of locations throughout refrigerator appliance 200. In the illustrated embodiment, the controller may be located within the control panel area of refrigerator door 226. In such an embodiment, input/output ("I/O") signals may be routed between the controller and various operational components of refrigerator appliance 200. The user interface assembly 300 may be in communication with the controller via one or more signal lines or shared communication busses. User interface assembly 300 provides selections for user manipulation of the operation of refrigerator appliance 200 such as e.g., selections between whole or crushed ice, chilled water, and/or other options as well. In response to user manipulation of the user interface assembly 300, the controller operates various components of the refrigerator appliance 200. The controller may include similar features and functionality as described above with respect to controller 1400 in FIG. 7 and/or controller 137 in FIG. 2.

FIG. 9 is a perspective view of an exemplary washing machine appliance 1100 and FIG. 10 is a side cross-sectional view of the washing machine appliance 1100. As illustrated, washing machine appliance 1100 generally defines a vertical direction V, a lateral direction L, and a transverse direction T, each of which is mutually perpendicular, such that an orthogonal coordinate system is generally defined. Washing machine appliance 1100 includes a cabinet 1102 that extends between a top 1104 and a bottom 1106 along the vertical direction V, between a left side 1108 and a right side 1110 along the lateral direction L, and between a front 1112 and a rear 1114 along the transverse direction T.

As illustrated in FIG. 10, a wash tub 1124 is mounted within cabinet 1102. A wash basket 1120 is received within the wash tub 1124 and the wash basket 1120 defines a wash chamber 1126 that is configured for receipt of articles for washing. Wash basket 1120 is rotatably mounted within cabinet 1102, e.g., within wash tub 1124, such that wash basket 1120 is rotatable about an axis of rotation 1101. A motor 1122, e.g., such as a pancake motor, is in mechanical communication with wash basket 1120 to selectively rotate wash basket 1120 (e.g., during an agitation or a rinse cycle of washing machine appliance 1100) about the axis 1101. In the example embodiment illustrated by FIG. 10, the axis 1101 may be oriented generally along or parallel to the transverse direction T of the washing machine appliance 1100. Accordingly, the washing machine appliance 1100 may be referred to as a horizontal axis washing machine.

The wash tub 1124 holds wash and rinse fluids for agitation in wash basket 1120 within wash tub 1124. As used herein, "wash fluid" may refer to water, detergent, fabric softener, bleach, or any other suitable wash additive or combination thereof.

Wash basket 1120 may define one or more agitator features that extend into wash chamber 1126 to assist in agitation and cleaning of articles disposed within wash chamber 1126 during operation of washing machine appliance 1100. For example, as illustrated in FIG. 10, a plurality of ribs 1128 extends from basket 1120 into wash chamber 1126. In this manner, for example, ribs 1128 may lift articles disposed in wash basket 1120 during rotation of wash basket 1120.

Referring generally to FIGS. 9 and 10, cabinet 1102 also includes a front panel 1130 which defines an opening 1132 that permits user access to wash basket 1120 within wash tub 1124. More specifically, washing machine appliance 1100 includes a door 1134 that is positioned in front of opening 1132 and is rotatably mounted to front panel 1130. Door 1134 is rotatable such that door 1134 permits selective access to opening 1132 by rotating between an open position (not shown) facilitating access to a wash tub 1124 and a closed position (FIG. 9) prohibiting access to wash tub 1124.

A window 1136 in door 1134 permits viewing of wash basket 1120 when door 1134 is in the closed position, e.g., during operation of washing machine appliance 1100. Door 1134 also includes a handle (not shown) that, e.g., a user may pull when opening and closing door 1134. Further, although door 1134 is illustrated as mounted to front panel 1130, it should be appreciated that door 1134 may be mounted to another side of cabinet 1102 or any other suitable support according to alternative embodiments.

Referring again to FIG. 10, wash basket 1120 also defines a plurality of perforations 1140 in order to facilitate fluid communication between an interior of basket 1120 and wash tub 1124. A sump 1142 is defined by wash tub 1124 at a bottom of wash tub 1124 along the vertical direction V. Thus, sump 1142 is configured for receipt of and generally collects wash fluid during operation of washing machine appliance 1100. For example, during operation of washing machine appliance 1100, wash fluid may be urged by gravity from basket 1120 to sump 1142 through plurality of perforations 1140. A pump assembly 1144 is located beneath tub 1124 for gravity assisted flow when draining tub 1124, e.g., via a drain 1146. Pump assembly 1144 may be configured for recirculating wash fluid within wash tub 1124.

A spout 1150 is configured for directing a flow of fluid into wash tub 1124. For example, spout 1150 may be in fluid communication with a water supply (not shown) in order to direct fluid (e.g., clean water) into wash tub 1214. Spout 1150 may also be in fluid communication with the sump 1142. For example, pump assembly 1144 may direct wash fluid disposed in sump 1142 to spout 1150 in order to circulate wash fluid in wash tub 1124.

As illustrated in FIG. 10, a detergent drawer 1152 is slidably mounted within front panel 1130. Detergent drawer 1152 receives a wash additive (e.g., detergent, fabric softener, bleach, or any other suitable liquid or powder) and directs the fluid additive to wash chamber 1124 during operation of washing machine appliance 1100. According to the illustrated embodiment, detergent drawer 1152 may also be fluidly coupled to spout 1150 to facilitate the complete and accurate dispensing of wash additive.

Additionally, a bulk reservoir 1154 is disposed within cabinet 1102. Bulk reservoir 1154 is also configured for receipt of fluid additive for use during operation of washing machine appliance 1100 (shown in FIG. 9). Bulk reservoir 1154 is sized such that a volume of fluid additive sufficient for a plurality or multitude of wash cycles of washing machine appliance 1100 (e.g., five, ten, twenty, fifty, or any other suitable number of wash cycles) may fill bulk reservoir 1154. Thus, for example, a user can fill bulk reservoir 1154 with fluid additive and operate washing machine appliance 1100 for a plurality of wash cycles without refilling bulk reservoir 1154 with fluid additive. A reservoir pump 1156 is configured for selective delivery of the fluid additive from bulk reservoir 1154 to wash tub 1124.

During operation of washing machine appliance 1100, laundry items are loaded into wash basket 1120 through opening 1132. Wash tub 1124 is filled with water, detergent, and/or other fluid additives, e.g., via spout 1150 and/or detergent drawer 1152. One or more valves (not shown) can be controlled by washing machine appliance 1100 to provide for filling wash basket 1120 to the appropriate level for the amount of articles being washed and/or rinsed. By way of example for a wash mode, once wash basket 1120 is properly filled with fluid, the contents of wash basket 1120 can be agitated (e.g., with ribs 1128) for washing of laundry items in wash basket 1120.

After the agitation phase of the wash cycle is completed, wash tub 1124 can be drained. Laundry articles can then be rinsed by again adding fluid to wash tub 1124, depending on the particulars of the cleaning cycle selected by a user. Ribs 1128 may again provide agitation within wash basket 1120. One or more spin cycles may also be used. In particular, a spin cycle may be applied after the wash cycle and/or after the rinse cycle in order to wring wash fluid from the articles being washed. During a spin cycle, basket 1120 is rotated at relatively high speeds. After articles disposed in wash basket 1120 are cleaned and/or washed, the user can remove the articles from wash basket 1120, e.g., by opening door 1134 and reaching into wash basket 1120 through opening 1132.

A control panel 1160 is coupled to front panel 1130. Control panel 1160 defines an outer surface 1162. The control panel 1160 and outer surface 1162 may be part of a user interface assembly 300 (FIG. 10) which includes buttons 302 for operator selection of machine cycles and features and corresponding indicator lights 304 to visually confirm or indicate selected cycles/features. As one example of such user interface, the control panel 1160 may be used as part of a capacitive touch sensing system to allow for the selective activation, adjustment, or control of the washing machine appliance 1100. In such embodiments, the control panel 1160 may be the dielectric panel of the capacitive touch system whereby the capacitive touch system registers touches on the outer surface 1162. The user interface assembly 300 may also provide for the selective activation, adjustment, or control of any timer features or other user-adjustable inputs. One or more of a variety of electrical, mechanical or electromechanical input devices including rotary dials, push buttons, toggle/rocker switches, and/or touch pads can also be used singularly or in combination with touch input components. Control panel 1160 may also include a display component, such as a digital or analog display device designed to provide operational feedback to a user.

Operation of washing machine appliance 1100 can be regulated by a controller 1166 that is operatively coupled, i.e., in communication with, user interface assembly 300. By way of example, the controller may include a memory and one or more processing devices such as microprocessors, CPUs or the like, such as general or special purpose microprocessors operable to execute programming instructions or micro-control code associated with operation of appliance 1100. The memory may represent random access memory such as DRAM, or read only memory such as ROM or FLASH. The memory may be a separate component from the processor or may be included onboard within the processor. In one embodiment, the processor executes programming instructions stored in memory. It should be noted that controllers 1166 as disclosed herein are capable of and may be operable to perform any methods and associated method steps as disclosed herein. For example, in some embodiments, methods disclosed herein may be embodied in programming instructions stored in the memory and executed by the controller 1166.

The controller 1166 may be positioned in a variety of locations throughout washing machine appliance 1100. In the illustrated embodiment, e.g., as shown in FIG. 9, the controller may be located under or next to the control panel 1160. In such an embodiment, input/output ("I/O") signals are routed between the controller and various operational components of appliance 1100 such as control panel 1160, sensors, graphical displays, and/or one or more alarms. In one embodiment, the control panel 1160 may represent a general purpose I/O ("GPIO") device or functional block. Control panel 1160 may be in communication with the controller via one or more signal lines or shared communication busses. A user of washing machine appliance 1100 may input and receive information regarding the operation of washing machine 1100 at control panel 1160. A variety of text, digits, and/or symbols may be printed on control panel 1160. In some embodiments, no text, digits, or symbols may appear on control panel 1160 unless washing machine appliance 1100 is in use.

This written description uses examples to disclose the technology, including the best mode, and also to enable any person skilled in the art to practice the technology, including making and using any devices or systems and performing any incorporated methods. The patentable scope of the technology is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An appliance comprising:
   a user interface assembly comprising a plurality of indicator lights mounted on a printed circuit board, a front panel comprising a plurality of apertures aligned with the plurality of indicator lights, and a translucent panel between the printed circuit board and the front panel; and
   an opaque material disposed between adjacent indicator lights of the plurality of indicator lights, whereby the opaque material reduces illumination of the printed circuit board by at least one indicator light of the plurality of indicator lights.

2. The appliance of claim 1, wherein the indicator lights of the plurality of indicator lights are reverse-mounted on the printed circuit board.

3. The appliance of claim 1, wherein each indicator light of the plurality of indicator lights is aligned with a corresponding aperture in the printed circuit board, and the opaque material surrounds at least one of the apertures corresponding to the adjacent indicator lights of the plurality of indicator lights.

4. The appliance of claim 3, wherein, when a first indicator light of the plurality of indicator lights is illuminated and a second indicator light of the plurality of indicator lights adjacent to the first indicator lights is not illuminated, the opaque material is positioned and configured to prevent light from the first indicator light travelling to the aperture in the printed circuit board corresponding to the second indicator light.

5. The appliance of claim 1, wherein, when a first indicator light of the plurality of indicator lights is illuminated and a second indicator light of the plurality of indicator lights adjacent to the first indicator lights is not illuminated, the opaque material is positioned and configured to prevent light from the first indicator light travelling to the aperture in the front panel corresponding to the second indicator light.

6. The appliance of claim 1, wherein the opaque material is a copper pour and the copper pour is electrically isolated from any circuits in the printed circuit board.

7. The appliance of claim 1, wherein the opaque material comprises a layer of ink silk screened onto at least one external surface of the printed circuit board.

8. The appliance of claim 1, wherein the plurality of indicator lights are arranged on the printed circuit board in a linear array.

9. The appliance of claim 1, wherein the appliance is a dishwasher appliance and the user interface assembly is positioned in a door of the dishwasher appliance.

10. The user interface assembly of claim 1, wherein, when a first indicator light of the plurality of indicator lights is illuminated and a second indicator light of the plurality of indicator lights adjacent to the first indicator lights is not illuminated, the opaque material is positioned and configured to prevent light from the first indicator light travelling to the aperture in the front panel corresponding to the second indicator light.

11. A user interface assembly for an appliance, comprising:
- a plurality of indicator lights mounted on a printed circuit board;
- a front panel comprising a plurality of apertures aligned with the plurality of indicator lights;
- a translucent panel between the printed circuit board and the front panel; and
- an opaque material disposed between adjacent indicator lights of the plurality of indicator lights, whereby the opaque material reduces illumination of the printed circuit board by at least one indicator light of the plurality of indicator lights.

12. The user interface assembly of claim 11, wherein the indicator lights of the plurality of indicator lights are reverse-mounted on the printed circuit board.

13. The user interface assembly of claim 11, wherein each indicator light of the plurality of indicator lights is aligned with a corresponding aperture in the printed circuit board, and the opaque material surrounds at least one of the apertures corresponding to the adjacent indicator lights of the plurality of indicator lights.

14. The user interface assembly of claim 13, wherein, when a first indicator light of the plurality of indicator lights is illuminated and a second indicator light of the plurality of indicator lights adjacent to the first indicator lights is not illuminated, the opaque material is positioned and configured to prevent light from the first indicator light travelling to the aperture in the printed circuit board corresponding to the second indicator light.

15. The user interface assembly of claim 11, wherein the opaque material is a copper pour and the copper pour is electrically isolated from any circuits in the printed circuit board.

16. The user interface assembly of claim 11, wherein the opaque material comprises a layer of ink silk screened onto at least one external surface of the printed circuit board.

17. The user interface assembly of claim 11, wherein the plurality of indicator lights are arranged on the printed circuit board in a linear array.

18. The user interface assembly of claim 11, wherein the appliance is a dishwasher appliance and the user interface assembly is positioned in a door of the dishwasher appliance.

* * * * *